United States Patent
Seshita

(10) Patent No.: US 8,461,911 B2
(45) Date of Patent: *Jun. 11, 2013

(54) SEMICONDUCTOR SWITCH FOR SWITCHING TERMINALS

(75) Inventor: Toshiki Seshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/614,108

(22) Filed: Sep. 13, 2012

(65) Prior Publication Data

US 2013/0038362 A1 Feb. 14, 2013

Related U.S. Application Data

(62) Division of application No. 12/876,449, filed on Sep. 7, 2010, now Pat. No. 8,289,072.

(30) Foreign Application Priority Data

Oct. 23, 2009 (JP) .................................. 2009-244305

(51) Int. Cl.
*G05F 1/10* (2006.01)
(52) U.S. Cl.
USPC ................ 327/536; 363/59; 363/60; 333/103

(58) Field of Classification Search
USPC ........................ 327/536; 363/59, 60; 333/103
See application file for complete search history.

(56) References Cited

U.S. PATENT DOCUMENTS

| | | | |
|---|---|---|---|
| 6,804,502 B2 | 10/2004 | Burgener et al. | |
| 7,106,121 B2 | 9/2006 | Hidaka et al. | |
| 8,289,072 B2 * | 10/2012 | Seshita | ........................ 327/536 |
| 2009/0023415 A1 | 1/2009 | Seshita | |
| 2011/0050323 A1 | 3/2011 | Seshita | |

FOREIGN PATENT DOCUMENTS

JP 2009027487 2/2009

* cited by examiner

*Primary Examiner* — Kenneth B. Wells
(74) *Attorney, Agent, or Firm* — Turocy & Watson, LLP

(57) ABSTRACT

According to one embodiment, a semiconductor switch includes a voltage generator, a driver, a switch section, and a power supply controller. The voltage generator is configured to generate a first potential and a negative second potential. The first potential is higher than a power supply voltage supplied to a power supply terminal. The driver is connected to an output of the voltage generator and is configured to output the first potential in response to input of high level and to output the second potential in response to input of low level. The switch section is configured to switch connection between terminals in response to an output of the driver. The power supply controller is configured to control the output of the voltage generator.

20 Claims, 17 Drawing Sheets

US 8,461,911 B2

SEMICONDUCTOR SWITCH FOR SWITCHING TERMINALS

CROSS-REFERENCE TO RELATED APPLICATIONS

This application is a Division of application Ser. No. 12/876,449 filed Sep. 7, 2010 now U.S. Pat. No. 8,289,072; the entire contents of which are incorporated herein by reference.

This application is based upon and claims the benefit of priority from Japanese Patent Application No. 2009-244305, filed on Oct. 23, 2009; the entire contents of which are incorporated herein by reference.

FIELD

Embodiments described herein relate generally to a semiconductor switch.

BACKGROUND

In a radio frequency circuit section of a cell phone, a transmitting circuit and a receiving circuit are selectively connected to a common antenna through a switch circuit for radio frequency signals. A switch element of such a switch circuit for radio frequency signals has conventionally been based on a high electron mobility transistor (HEMT) made of compound semiconductor. Recently, it has been under consideration in view of requirements for cost reduction and downsizing that the HEMT will be replaced with a metal oxide semiconductor field effect transistor (MOSFET) formed on a silicon substrate.

However, the conventional MOSFET formed on a silicon substrate has large parasitic capacitance between a source or drain electrode and the silicon substrate. Another problem is that the radio frequency signal incurs large power loss because silicon is a semiconductor. In this context, a technique is proposed in which a switch circuit for radio frequency signals is formed on an silicon on insulator (SOI) substrate.

In a radio frequency switch based on MOSFET, for example, to achieve radio frequency characteristics (such as insertion loss and ON distortion/OFF distortion) required for cell phones, it is necessary to generate an appropriate gate potential inside the radio frequency switch.

However, such a voltage generator is limited in current supply capacity because of restriction on the layout area. Hence, if a cross current over the current supply capacity occurs in the load of the voltage generator at power-on, there is a possibility of an incorrect operation in which the voltage generator fails to reach the desired potential.

DETAILED DESCRIPTION

Figure 1:
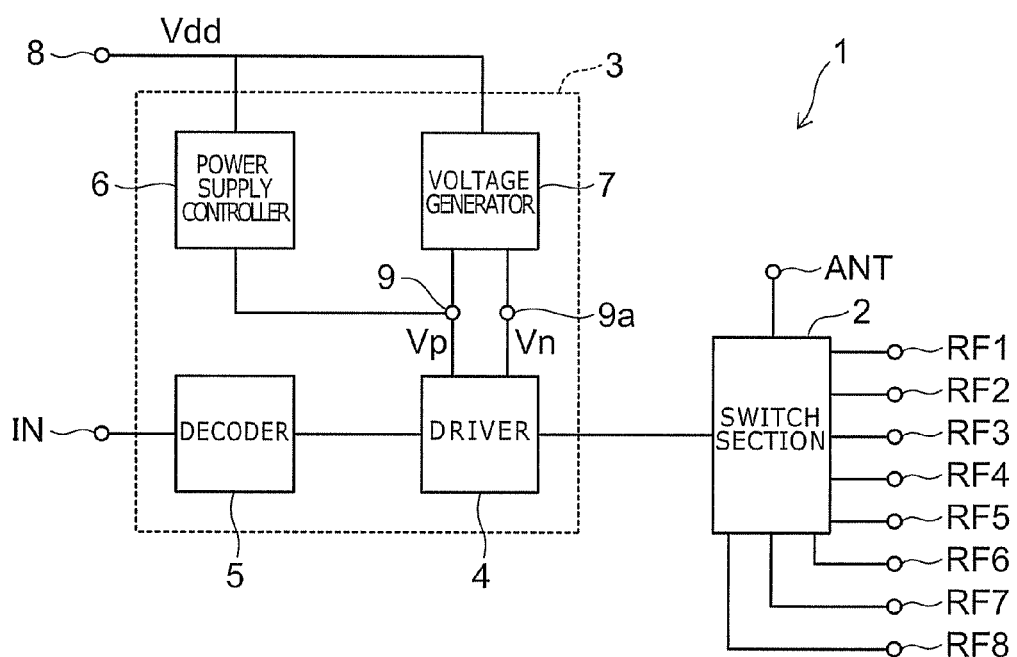
FIG. 1 is a block diagram illustrating the configuration of a semiconductor switch according to an embodiment.

In general, according to one embodiment, a semiconductor switch includes a voltage generator, a driver, a switch section, and a power supply controller. The voltage generator is configured to generate a first potential and a negative second potential. The first potential is higher than a power supply voltage supplied to a power supply terminal. The driver is connected to an output of the voltage generator and includes a first level shifter and a second level shifter. The first level shifter is configured to output the first potential in response to input of high level and to output low level in response to input of low level. The second level shifter is configured to output the first potential in response to input of the first potential of an output of the first level shifter and to output the second potential in response to input of low level of the output of the first level shifter. The switch section is configured to switch connection between terminals in response to an output of the driver. The power supply controller is configured to control the output of the voltage generator to be connected to the power supply terminal during a first period after supplying the power supply voltage to the power supply terminal. The power supply controller is configured to control the output of the voltage generator to be disconnected from the power supply terminal after expiration of the first period.

Embodiments of the invention will now be described in detail with reference to the drawings.

In the specification and drawings, components similar to those described previously with reference to earlier figures are labeled with like reference numerals, and the detailed description thereof is omitted as appropriate.

FIG. 1 is a block diagram illustrating the configuration of a semiconductor switch according to an embodiment.

As shown in FIG. 1, a semiconductor switch 1 includes a switch section 2, a driver 4, a decoder 5, a power supply controller 6, a voltage generator 7, and a power supply terminal 8. These are formed on the same substrate to provide a one-chip structure. For example, these are formed on a SOI substrate.

For example, a multiport switch section such as an single-pole 8-throw (SP8T) is used for multiport multiband wireless devices and the like.

The semiconductor switch 1 is a multiport semiconductor switch, which can be used for the multiport multiband wireless devices and the like.

The switch section 2 switches connection between terminals. In FIG. 1, the switch section 2 is an SP8T. The switch section 2 switches connection between an antenna terminal ANT and eight radio frequency terminals RF1 to RF8. The switch section 2 can be constructed from MOSFETs, for example.

Figure 2:
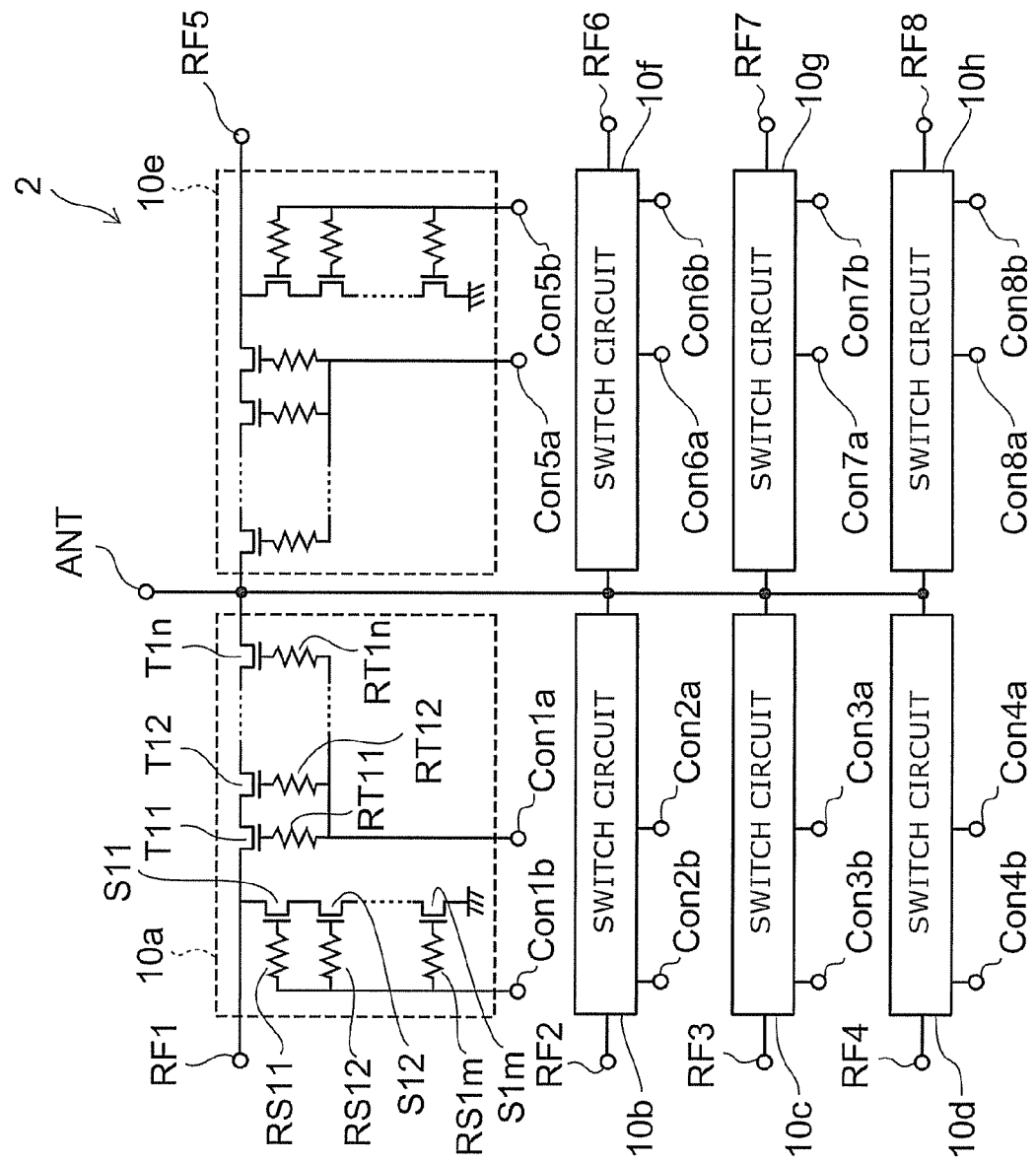
FIG. 2 is a circuit diagram illustrating the configuration of a switch section of the semiconductor switch shown in FIG. 1.

FIG. 2 is a circuit diagram illustrating the configuration of the switch section 2 of the semiconductor switch 1 shown in FIG. 1.

As shown in FIG. 2, switch circuits 10a to 10h are connected between the antenna terminal ANT and the radio frequency terminals RF1 to RF8, respectively.

Each of the switch circuits 10a to 10h includes through field effect transistors (FETs) of n stages (n being a natural number), shunt FETs of m stages (m being a natural number), and resistors for preventing leakage of radio frequency.

The through FETs T11, T12, . . . , T1n of the switch circuit 10a are connected in series between the antenna terminal ANT and the radio frequency terminal RF1. The shunt FETs S11, S12, . . . , S1m of the switch circuit 10a are connected in series between the radio frequency terminal RF1 and the ground.

The gates of the through FETs T11, T12, . . . , T1n of the switch circuit 10a connected to the radio frequency terminal RF1 are connected to a control terminal Con1a respectively through resistors RT11, RT12, . . . , RT1n for preventing leakage of radio frequency. The control terminal Con1a is connected to the driver 4. Each of the resistors RT11, RT12, . . . , RT1n has a resistance high enough to avoid leakage of radio frequency signals to the driver 4.

The gates of the shunt FETs 511, S12, . . . , S1m of the switch circuit 10a connected to the radio frequency terminal RF1 are connected to a control terminal Con1b respectively through resistors RS11, RS12, . . . , RS1m for preventing leakage of radio frequency. The control terminal Con1b is connected to the driver 4. Each of the resistors RS11, RS12, . . . , RS1m has a resistance high enough to avoid leakage of radio frequency signals to the driver 4.

Similarly, the through FETs of the switch circuits 10b to 10h are connected between the antenna terminal ANT and the radio frequency terminals RF2 to RF8, respectively. The shunt FETs of the switch circuits 10b to 10h are connected between the radio frequency terminals RF2 to RF8 and the ground, respectively.

The gates of the through FETs of the switch circuits 10b to 10h connected to the radio frequency terminals RF2 to RF8 are connected to control terminals Con2a to Con8a through resistors for preventing leakage of radio frequency, respectively. Each of the control terminals Con2a to Con8a is connected to the driver 4.

The gates of the shunt FETs of the switch circuits 10b to 10h connected to the radio frequency terminals RF2 to RF8 are connected to control terminals Con2b to Con8b through resistors for preventing leakage of radio frequency, respectively. Each of the control terminals Con2b to Con8b is connected to the driver 4.

For example, the n-stage-series-connected through FETs T11 to T1n between the radio frequency terminal RF1 and the antenna terminal ANT are turned on and the m-stage-series-connected shunt FETs S11 to S1m between the radio frequency terminal RF1 and the ground are turned off. Simultaneously, all the through FETs between the other radio frequency terminals RF2 to RF8 and the antenna terminal ANT are turned off and all the shunt FETs between the other radio frequency terminals RF2 to RF8 and the ground are turned on. It makes conduction between the radio frequency terminal RF1 and the antenna terminal ANT.

More specifically, in the above case, the control terminal Con1a is placed at an ON potential Von, the control terminals Con2b to Con8b are placed at the ON potential Von, the control terminal Con1b is placed at an OFF potential Voff, and the control terminals Con2a to Con8a are placed at the OFF potential Voff. The ON potential Von is a gate potential that brings each FET into the conducting state and that makes its ON resistance a sufficiently small value. The OFF potential Voff is a gate potential that brings each FET into the blocking state and that can sufficiently maintain the blocking state even under superposition of radio frequency signals. A threshold voltage Vth of each FET is, for example, 0 V.

If the ON potential Von is lower than a desired potential (e.g., 3.5 V), the ON resistance of the FET in the conducting state increases. This degrades insertion loss and increases distortion generated by the FET in the conducting state (ON distortion). If the OFF potential Voff is higher than a desired potential (e.g., −1.5 V), the maximum allowable input power decreases. This increases distortion generated by the FET in the blocking state for rated input (OFF distortion).

However, an extremely high ON potential Von or an extremely low OFF potential Voff will exceed the breakdown voltage of the FET. Hence, there is an optimal range for the ON potential Von and the OFF potential Voff.

Control signals for controlling the gate potential of each FET of the switch section 2 are generated by a controller section 3 shown in FIG. 1.

The controller section 3 is constructed from a decoder 5 for decoding a terminal switching signal inputted to a terminal IN, a driver 4 for driving the switch section 2, a voltage generator 7, etc.

Figure 3:
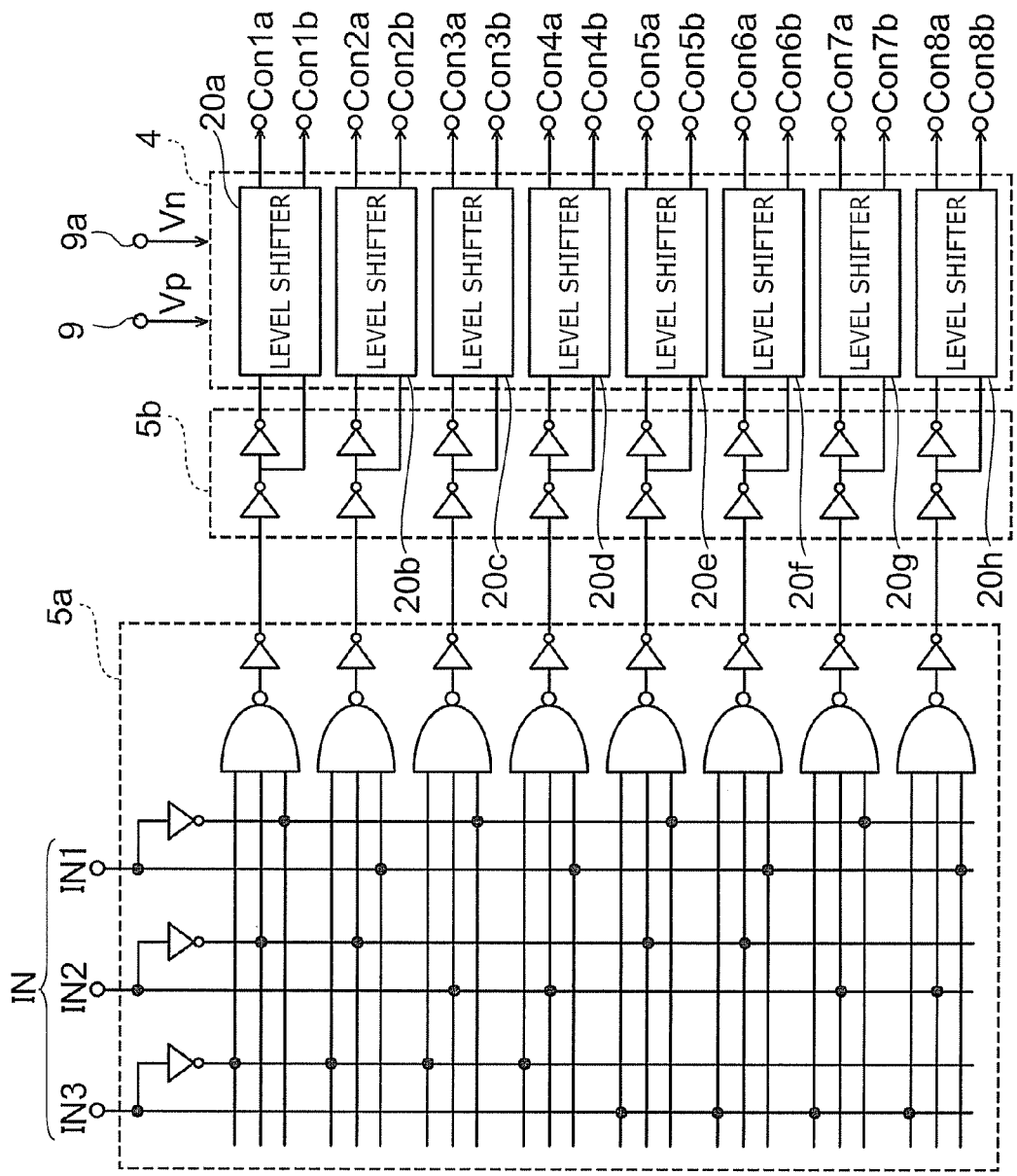
FIG. 3 is a circuit diagram illustrating the configuration of a decoder and a driver of the semiconductor switch shown in FIG. 1.

FIG. 3 is a circuit diagram illustrating the configuration of the decoder 5 and the driver 4 of the semiconductor switch 1 shown in FIG. 1.

As shown in FIG. 3, the terminal switching signal is decoded by the decoder 5a and controls the driver 4 through an inverted/non-inverted signal generator 5b. Here, the semiconductor switch 1 includes an SP8T switch section 2. Thus, the decoder 5a decodes a 3-bit terminal switching signal.

The driver 4 has a configuration in which eight level shifters 20a to 20h are disposed. The driver 4 includes a high potential terminal 9 and a low potential terminal 9a. The high potential terminal 9 is supplied with a first potential Vp higher than the power supply voltage Vdd supplied to the power supply terminal 8. The low potential terminal 9a is supplied with a negative second potential Vn.

Because the level shifters 20a to 20h are differential circuits, the inverted/non-inverted signal generator 5b is provided between the decoder 5a and the driver 4. The other circuit sections, such as the decoder 5a in the preceding stage of the driver 4, are powered with a potential Vdd1. Here, the potential Vdd1 is, for example, 1.8 V and supplied by a not-illustrated regulator. Alternatively, the potential Vdd1 may be the same as the power supply voltage Vdd.

Figure 4:
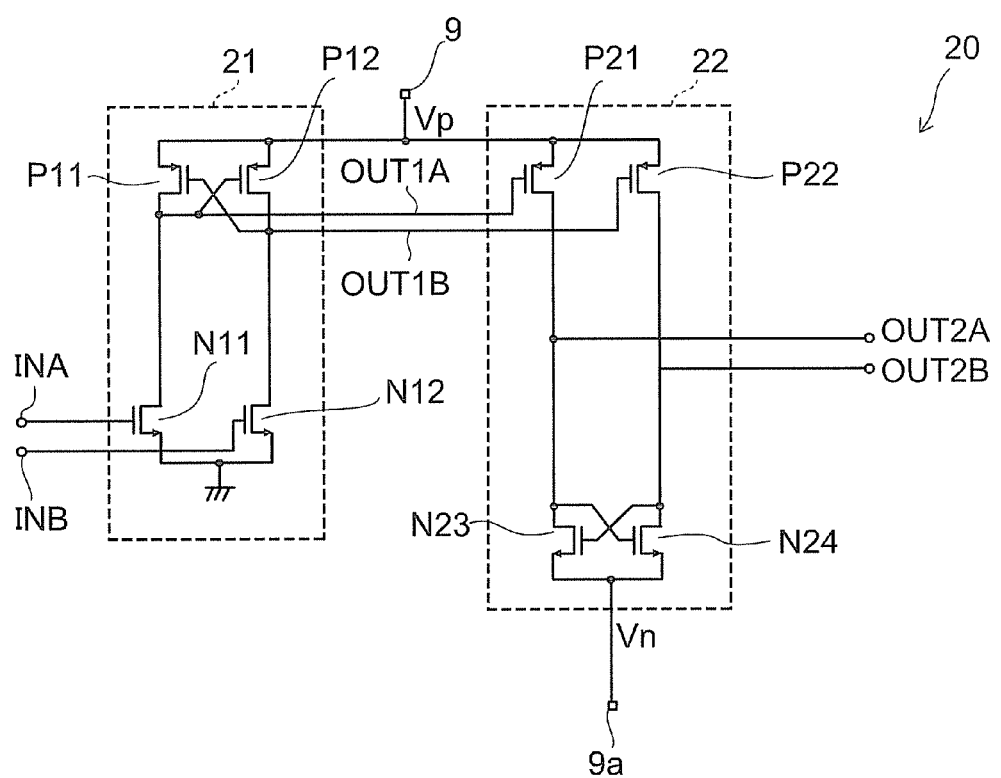
FIG. 4 is a circuit diagram illustrating the configuration of a level shifter.

FIG. 4 is a circuit diagram illustrating the configuration of a level shifter.

FIG. 4 shows a circuit diagram of a level shifter 20 constituting the driver 4.

The driver 4 is constructed from level shifters 20a to 20h having the same configuration as the level shifter 20.

The level shifter 20 includes a first level shifter 21 and a second level shifter 22. The first level shifter 21 includes a pair of N-channel MOSFETs (hereinafter NMOSs) N11 and N12 and a pair of P-channel MOSFETs (hereinafter PMOSs) P11 and P12. The second level shifter 22 includes a pair of PMOSs P21 and P22 and a pair of NMOSs N23 and N24.

Each of the sources of the NMOSs N11 and N12 is connected to the ground. The gates of the NMOSs N11 and N12 are connected to the not-illustrated decoder in the preceding stage through input terminals INA and INB, respectively.

The drains of the NMOSs N11 and N12 are connected to the drains of the PMOSs P11 and P12, respectively. The source of each of the PMOSs P11 and P12 is supplied with the first potential Vp from the voltage generator 7 through the high potential terminal 9. The gate of the PMOS P11 is connected to the drain of the PMOS P12, and this connection node is connected to one line OUT1B of the differential outputs of the first level shifter 21. The gate of the PMOS P12 is connected to the drain of the PMOS P11, and this connection node is connected to the other line OUT1A of the differential outputs of the first level shifter 21.

The aforementioned lines OUT1A and OUT1B are connected to the gates of the PMOSs P21 and P22 of the second level shifter 22, respectively. The output of the first level shifter 21 is inputted to the second level shifter 22 through the lines OUT1A and OUT1B. The source of each of the PMOSs P21 and P22 is supplied with the first potential Vp from the voltage generator 7 through the high potential terminal 9.

The drain of the PMOS P21 is connected to the drain of the NMOS N23, and the connection node thereof is connected to an output terminal OUT2A. The drain of the PMOS P22 is connected to the drain of the NMOS N24, and the connection node thereof is connected to an output terminal OUT2B. The aforementioned ON potential Von and OFF potential Voff are supplied through the output terminals OUT2A and OUT2B to the gates of the through FETs and shunt FETs of the switch section 2 shown in FIG. 2.

The input level of the differential inputs INA and INB of the first level shifter 21 has, for example, a high level of 1.8 V and a low level of 0 V. The input is supplied from the not-illustrated decoder in the preceding stage. For example, 3.5 V is supplied as the first potential Vp to the high potential terminal 9.

For example, if INA is inputted with high level (1.8 V) and INB is inputted with low level (0 V), the potential of the line OUT1A is set to low level (0 V), and the potential of the line OUT1B is set to 3.5 V, which is equal to the first potential Vp.

In other words, the output amplitude in the first level shifter 21 is approximately 3.5 V, from 0 to Vp.

The second level shifter 22 receives the output signal of the first level shifter 21. For example, 3.5 V is supplied as the first potential Vp to the high potential terminal 9 similar to the first level shifter 21, and, for example, −1.5 V is supplied as the negative second potential Vn to the low potential terminal 9a.

For example, if the line OUT1A is placed at low level (0 V) and the line OUT1B is placed at high level (3.5 V), the potential of the output terminal OUT2A is set to 3.5 V, which is equal to the first potential Vp, and the potential of the output terminal OUT2B is set to −1.5 V, which is equal to the second potential Vn. Accordingly, 3.5 V as an ON potential Von and −1.5 V as an OFF potential Voff can be supplied to the gates of the through FETs and shunt FETs of the switch section 2 shown in FIG. 2. Thus, the switch section 2 is driven.

In other words, in response to a differential input signal in which the input high level is Vdd1 and low level is 0 V, the first level shifter 21 outputs a differential signal in which the high level is the first potential Vp and the low level is 0 V (ground potential). That is, the first level shifter 21 transforms the potential of the high level to the first potential Vp. Furthermore, in response to this output level, the second level shifter 22 outputs a differential signal in which the high level is the first potential Vp and the low level is the second potential Vn. That is, the second level shifter 22 transforms the potential of the low level to the second potential Vn.

Accordingly, in response to a differential input signal in which the input high level is Vdd1 and low level is 0 V, the level shifter 20 outputs a differential signal in which the high level is the first potential Vp and the low level is the second potential Vn. That is, the level shifter 20 transforms the inputted potentials of the high level and the low level to the first potential Vp and the second potential Vn, respectively.

Figure 5:
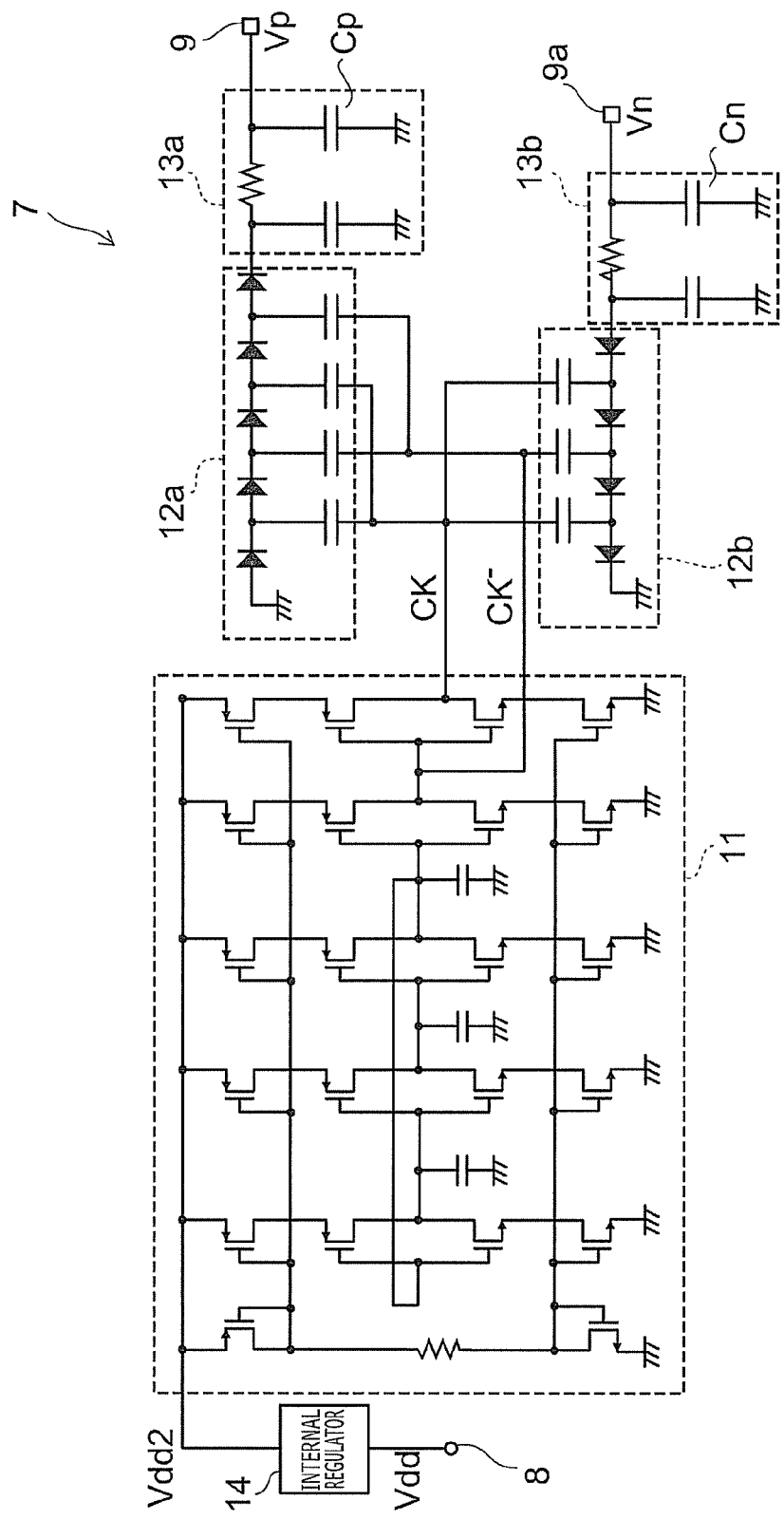
FIG. 5 is a circuit diagram illustrating the configuration of a voltage generator of the semiconductor switch shown in FIG. 1.

FIG. 5 is a circuit diagram illustrating the configuration of the voltage generator 7 of the semiconductor switch 1 shown in FIG. 1.

As shown in FIG. 5, the voltage generator 7 includes an oscillator 11, charge pumps 12a and 12b, low-pass filters 13a and 13b, and an internal regulator 14.

The oscillator 11 is a ring oscillator constructed from inverters of odd stages and outputs complementary clock signals CK and CK−.

The charge pump 12a includes a plurality of series connected diodes and a plurality of capacitors with one end connected to between the diodes. The anode side of the plurality of series connected diodes is connected to the ground, and the cathode side thereof is connected to the low-pass filter 13a. The other ends of the capacitors are connected alternately to the complementary clock signals CK and CK−, which are outputs of the oscillator 11.

The charge pump 12b includes a plurality of series connected diodes and a plurality of capacitors with one end connected to between the diodes. The cathode side of the plurality of series connected diodes is connected to the ground, and the anode side thereof is connected to the low-pass filter 13b. The other ends of the capacitors are connected alternately to the complementary clock signals CK and CK−, which are outputs of the oscillator 11. The charge pump 12b is different from the charge pump 12a in the direction and number of diodes.

In response to accumulation and migration of charge by the complementary clock signals CK and CK−, a positive voltage and a negative voltage are generated in the charge pumps 12a and 12b, respectively.

The low-pass filters 13a and 13b are each constructed from a resistor and capacitors. The output of the charge pumps 12a and 12b is smoothed by the low-pass filters 13a and 13b and outputted to the high potential terminal 9 and the low potential terminal 9a, respectively.

The terminal voltage of the output side capacitor Cp of the low-pass filter 13a connected to the high potential terminal 9 serves as the first potential Vp.

The terminal voltage of the output side capacitor Cn of the low-pass filter 13b connected to the low potential terminal 9a serves as the second potential Vn.

Although not shown, the high potential terminal 9 and the low potential terminal 9a are each provided with a clamp circuit or regulator as a circuit for holding the potential constant.

The potential Vdd2 of the power supplied to the oscillator 11 is lower than the power supply voltage Vdd and is, for example, 2.4 V. As shown in FIG. 5, the power of the potential Vdd2 is supplied from the internal regulator 14. Alternatively, the voltage Vdd may be supplied from the power supply terminal 8 without the intermediary of the internal regulator 14.

Figure 6:
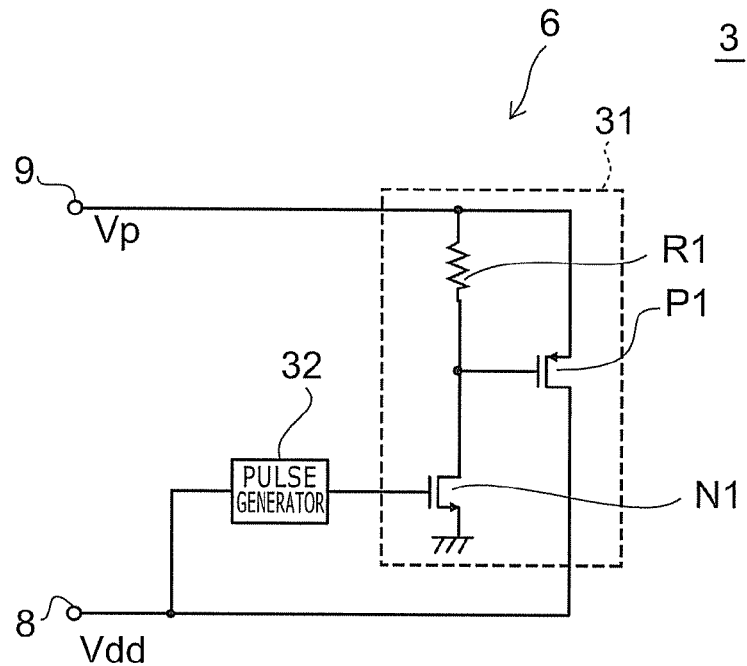
FIG. 6 is a circuit diagram illustrating the configuration of a power supply controller of the semiconductor switch shown in FIG. 1.

FIG. 6 is a circuit diagram illustrating the configuration of the power supply controller 6 of the semiconductor switch 1 shown in FIG. 1.

As shown in FIG. 6, the power supply controller 6 includes a connecting circuit 31 and a pulse generator 32.

The pulse generator 32 is a circuit that generates a pulse of high level at power-on, i.e., during a first period T1 after the power supply terminal 8 is supplied with the power supply voltage. The pulse generator 32 outputs high level during the first period T1 after power-on, and outputs low level after the expiration of the first period.

Here, the first period T1 is the period (e.g., 5 μs) required for the output side capacitor Cp of the low-pass filter 13a to be charged to the power supply voltage Vdd by the power supply terminal 8 through a second transistor P1.

The output of the pulse generator 32 is inputted to the connecting circuit 31.

The connecting circuit 31 is a circuit that connects and disconnects between the high potential terminal 9 and the power supply terminal 8. The connecting circuit 31 includes a first transistor N1, a second transistor P1, and a first resistor R1.

The output of the pulse generator 32 is inputted to the gate of the first transistor N1. The source of the first transistor N1 is grounded. The drain of the first transistor N1 is connected to the high potential terminal 9 through the first resistor R1. Furthermore, the drain of the first transistor N1 is connected to the gate of the second transistor P1. The source of the second transistor P1 is connected to the high potential terminal 9. The drain of the second transistor P1 is connected to the power supply terminal 8.

During the first period T1 when high level is outputted from the pulse generator 32, the first transistor N1 is turned on. Hence, the second transistor P1 is turned on, and the high potential terminal 9 is connected to the power supply terminal 8. In the case where the output of the pulse generator 32 is low level, the first transistor N1 and the second transistor P1 are turned off, and the high potential terminal 9 is disconnected from the power supply terminal 8.

Thus, the power supply controller 6 is a circuit that controls the output of the voltage generator 7 (high potential terminal 9) to be connected to the power supply terminal 8 during the first period T1 and controls the output of the voltage generator 7 (high potential terminal 9) to be disconnected from the power supply terminal 8 after the expiration of the first period T1.

Here, the potential Vdd1 of the power supplied to the pulse generator is, for example, 1.8 V, and it is supplied by a not-illustrated regulator. Alternatively, the potential Vdd1 may be the same as the power supply voltage Vdd.

In FIG. 6, the drain of the second transistor P1 is connected to the power supply terminal 8. However, alternatively, the drain of the second transistor P1 may be connected to the output of the internal regulator 14 shown in FIG. 5, which is connected to the power supply terminal 8 and generates the potential Vdd2 lower than the power supply voltage Vdd.

More specifically, the power supply controller 6 may be configured to control the output of the voltage generator 7 (high potential terminal 9) to be connected to the output of the internal regulator 14, which generates the potential Vdd2 lower than the power supply voltage Vdd, during the first period T1. After the expiration of the first period T1, the power supply controller 6 may be configured to control the output of the voltage generator 7 (high potential terminal 9) to be disconnected from the output of the internal regulator 14.

Figure 7:
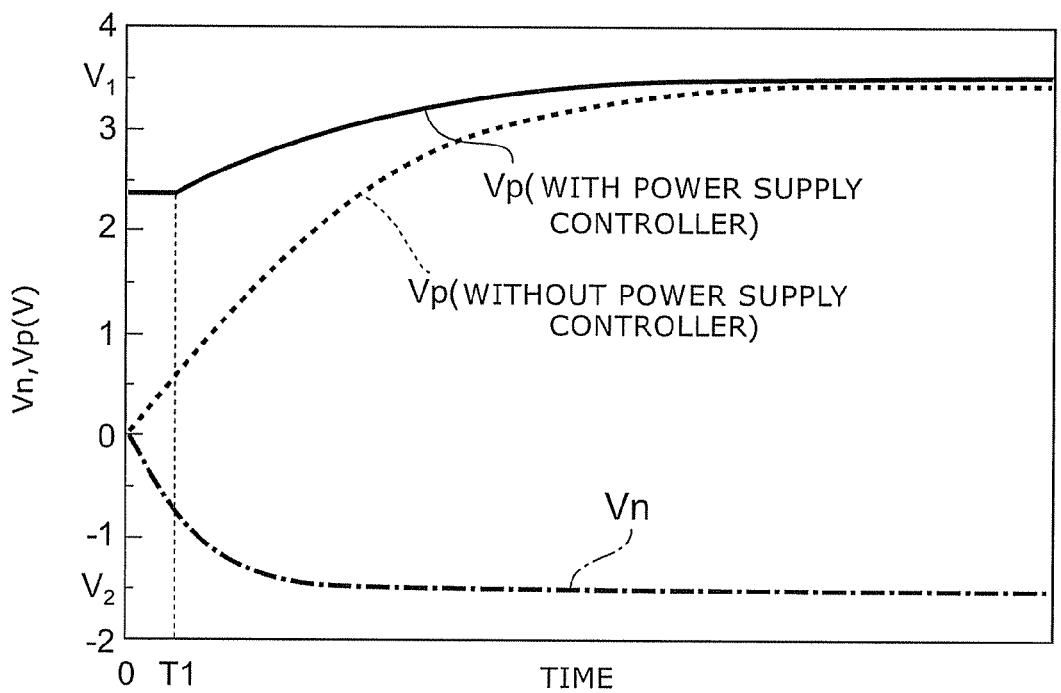
FIG. 7 is a graph showing time variations of output potentials of the voltage generator.

FIG. 7 is a graph showing time variations of output potentials of the voltage generator.

FIG. 7 shows time variations of the first and second potentials Vp and Vn after power-on at time t=0 in the case of no load. It is assumed that the power supply voltage Vdd supplied to the power supply terminal 8 is 2.4 V. For the first potential Vp, the cases with and without the power supply controller 6 are shown by the solid line and the dashed line, respectively.

During the first period T1 after power-on, the output of the voltage generator 7, i.e., the first potential Vp, is maintained at the power supply voltage Vdd supplied to the power supply terminal 8. Subsequently, the first potential Vp is raised to a desired value $V_1$ (3.5 V in this example) of the first potential Vp. As shown by the dashed line, in the case without the power supply controller 6 shown as a comparative example, the first potential Vp starts to be raised from 0 V. On the other hand, the second potential Vn starts at 0 V and gradually approaches a desired value $V_2$ (−1.5 V in this example).

The advantage of using the CMOS process is that such a controller section 3 can be realized with high integration and low power consumption and can be integrated with the switch section 2.

However, there is a limit to the layout area of the oscillator and the charge pump which can be built in the controller section 3. Hence, the current supply capacity of the charge pump is not necessarily high.

In the semiconductor switch 1 shown in FIG. 1, the load of the charge pumps 12a and 12b is the driver 4 including the aforementioned level shifter 20.

If this level shifter 20 is connected as a load to the charge pumps 12a and 12b, a cross current may occur from the high potential terminal 9 to the low potential terminal 9a.

More specifically, after power-on until the first potential Vp and the second potential Vn reach the desired potentials $V_1$ and $V_2$, respectively, a cross current may occur in the second level shifter 22 from the high potential terminal 9 to the low potential terminal 9a. There is no problem if the current supply capacity of the charge pumps 12a and 12b is sufficiently higher than the cross current. However, if the current supply capacity is insufficient, there is a risk of malfunction of the first potential Vp and the second potential Vn failing to reach the desired potentials.

The configuration of the semiconductor switch 1 according to the embodiment of the invention is constructed on the basis of the phenomenon of the cross current across the level shifter. This phenomenon has been newly discovered from the simulation results described below.

The operation of the level shifter 20 shown in FIG. 4 is described with reference to the simulation results shown in FIG. 8 to FIG. 15.

Figure 8:
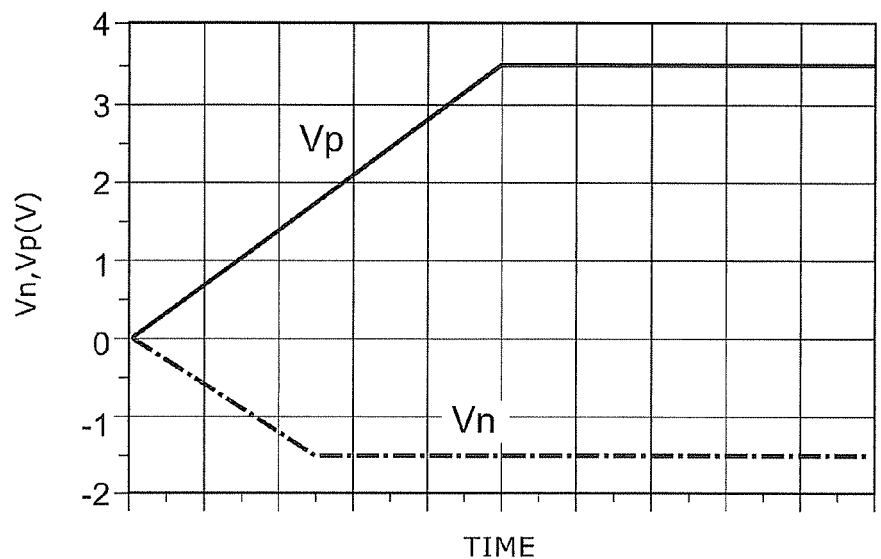
FIG. 8 is a graph showing time variations of output potentials of the voltage generator used in a simulation of a level shifter.
Figure 9:
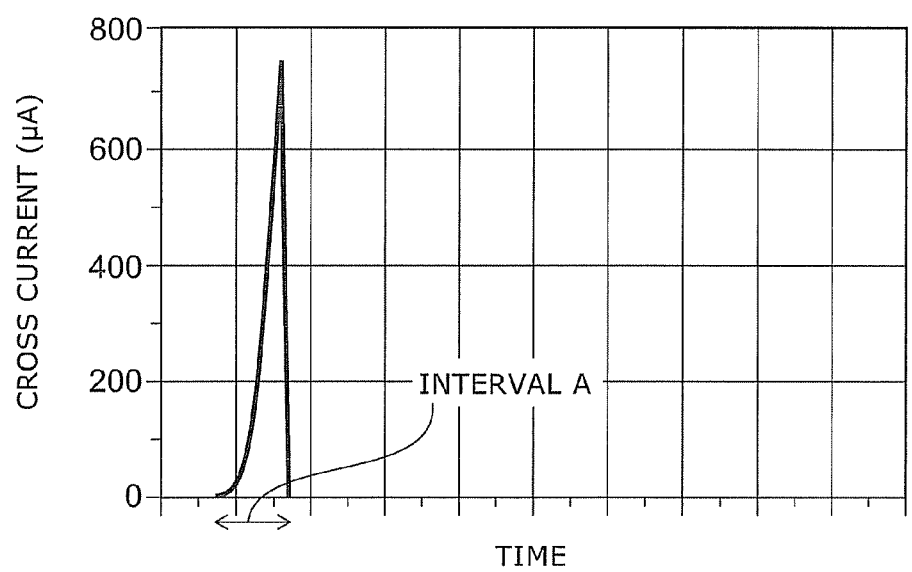
FIG. 9 is a graph showing a time variation of the cross current.
Figure 10:
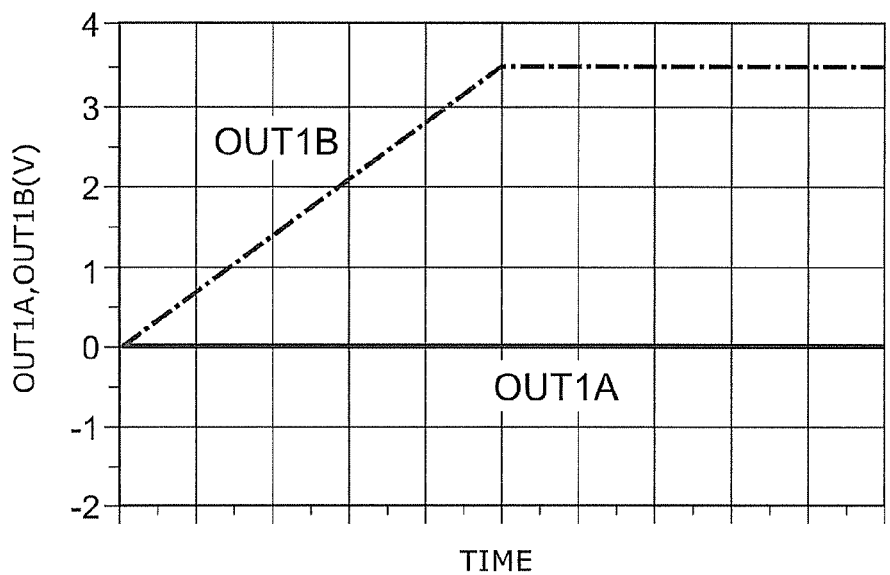
FIG. 10 is a graph showing time variations of outputs of a first level shifter.
Figure 11:
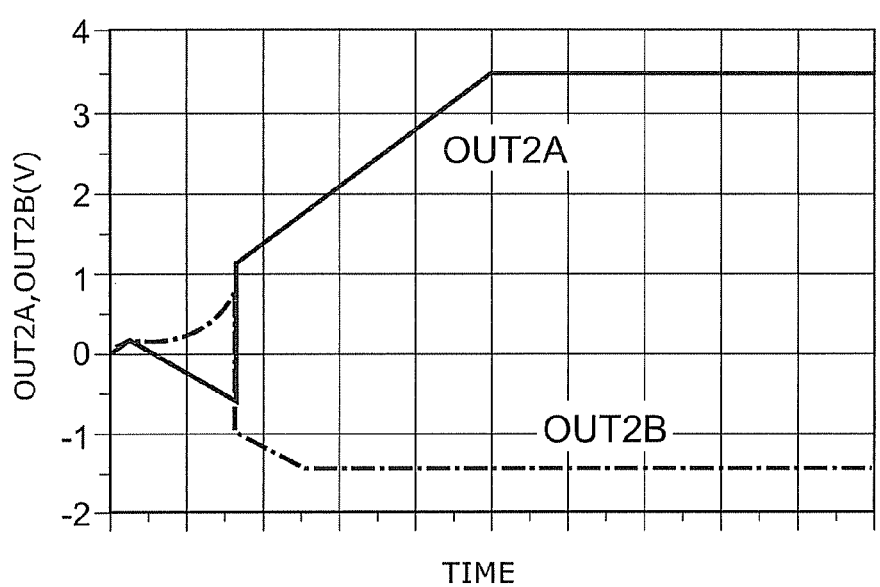
FIG. 11 is a graph showing time variations of outputs of a second level shifter.

FIG. 8 is a graph showing time variations of output potentials of the voltage generator used in the simulation of the level shifter. FIG. 9 is a graph showing a time variation of the cross current. FIG. 10 is a graph showing time variations of the outputs OUT1A and OUT1B of the first level shifter. FIG. 11 is a graph showing time variations of the outputs OUT2A and OUT2B of the second level shifter.

The input terminal INA of the level shifter 20 is applied with high level (1.8 V), and the input terminal INB is applied with low level (0 V). FIG. 9 shows a cross current in the case where the high potential terminal 9 of the level shifter 20 is applied with the first potential Vp and the low potential terminal 9a is applied with the second potential Vn. The first potential Vp and the second potential Vn are given by the waveforms shown in FIG. 8. FIG. 10 and FIG. 11 show the potential of the respective nodes.

Here, the threshold voltage of the NMOS is 0.6 V, and the threshold voltage of the PMOS is −0.6 V.

FIG. 12 to FIG. 15 show waveforms of a gate-source voltage Vgs and a drain-source voltage Vds of the respective FETs.

Figure 12:
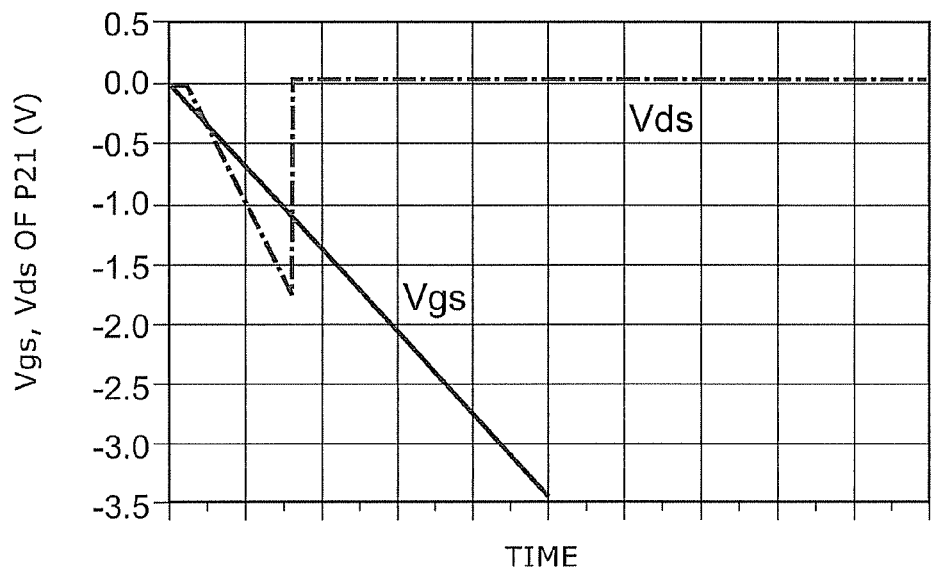
FIG. 12 is a graph showing time variations of a gate-source voltage and a drain-source voltage of PMOS P21.
Figure 13:
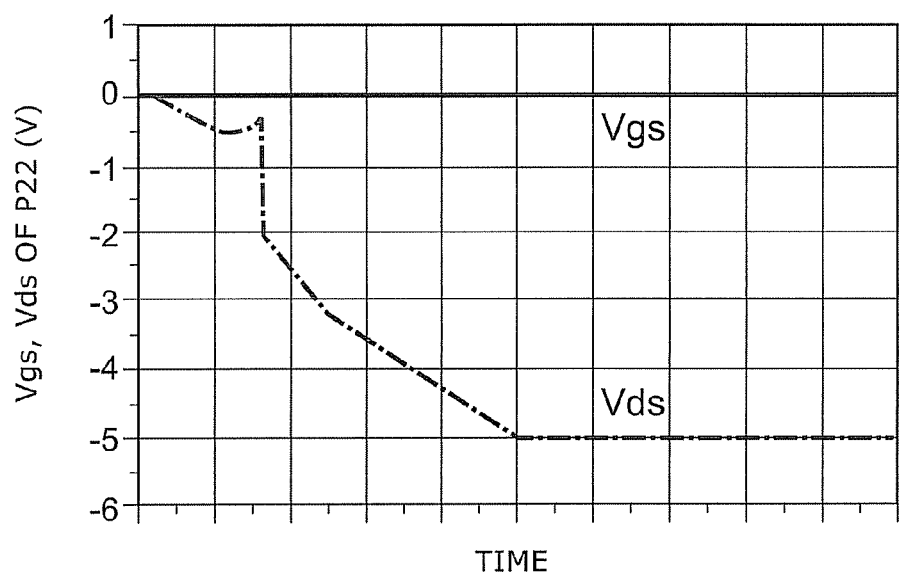
FIG. 13 is a graph showing time variations of a gate-source voltage and a drain-source voltage of PMOS P22.
Figure 14:
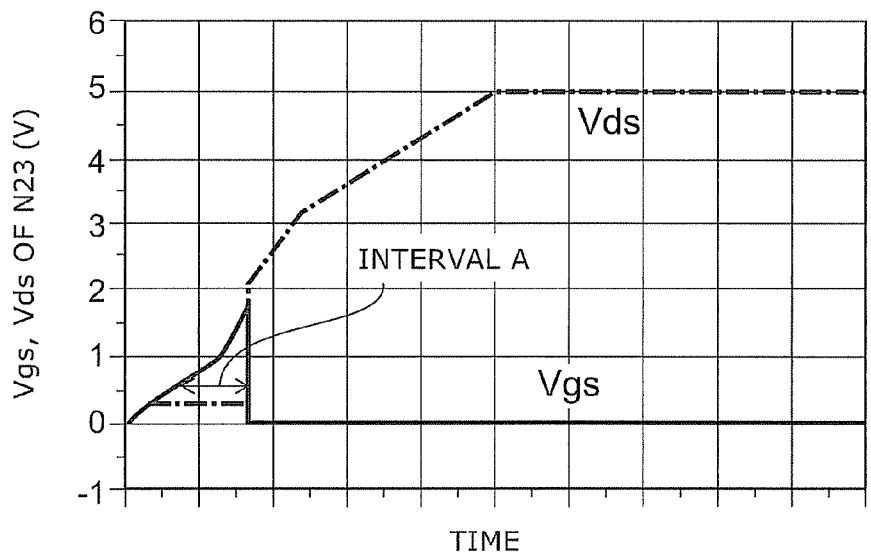
FIG. 14 is a graph showing time variations of a gate-source voltage and a drain-source voltage of NMOS N23.
Figure 15:
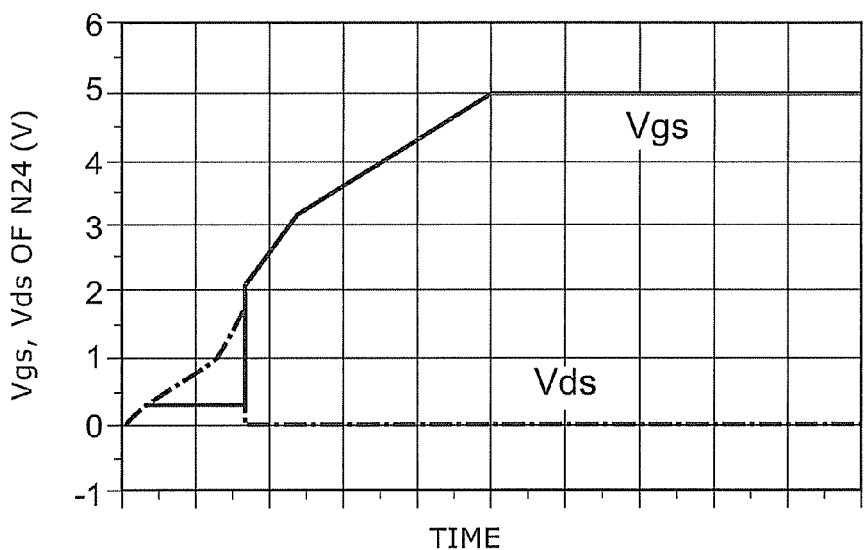
FIG. 15 is a graph showing time variations of a gate-source voltage and a drain-source voltage of NMOS N24.

FIG. 12 is a graph showing time variations of a gate-source voltage Vgs and a drain-source voltage Vds of the PMOS P21. FIG. 13 is a graph showing time variations of a gate-source voltage Vgs and a drain-source voltage Vds of the PMOS P22. FIG. 14 is a graph showing time variations of a gate-source voltage Vgs and a drain-source voltage Vds of the NMOS N23. FIG. 15 is a graph showing time variations of a gate-source voltage Vgs and a drain-source voltage Vds of the NMOS N24.

Referring to FIG. 12 and FIG. 14, FIG. 12 shows the gate-source voltage Vgs and the drain-source voltage Vds of the PMOS P21. The PMOS P21 remains turned on after the gate-source voltage Vgs reaches −0.6 V.

On the other hand, FIG. 14 shows the gate-source voltage Vgs and the drain-source voltage Vds of the NMOS N23.

In the interval A shown in FIG. 14, the gate-source voltage Vgs exceeds 0.6 V, and the NMOS N23 is turned on. In other words, in the interval A, the PMOS P21 and the NMOS N23 are both turned on. Thus, as shown in FIG. 9, in the interval A, a cross current occurs from the high potential terminal 9 to the low potential terminal 9a. The cross current is approximately several hundred microamperes. If the charge pumps for generating the first potential Vp and the second potential Vn do not have current supply capacity over the cross current, the first potential Vp and the second potential Vn are clamped by the cross current. The current supply capacity of a charge pump which can be built in a switch IC is at most several ten microamperes. Hence, this results in the startup error of the first potential Vp and the second potential Vn failing to reach the desired values $V_1$ and $V_2$.

As described above, the cross current may occur in a level shifter with a two-stage configuration.

Figure 16:
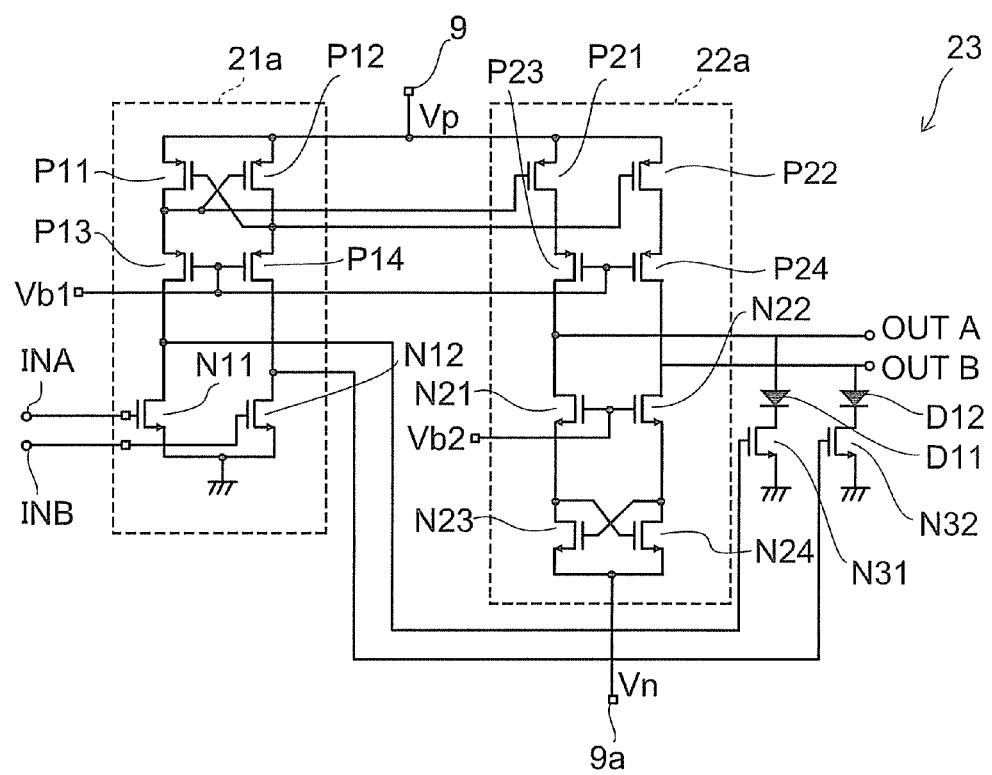
FIG. 16 is a circuit diagram illustrating one other configuration of a level shifter.

FIG. 16 is a circuit diagram illustrating one other configuration of a level shifter.

As shown in FIG. 16, to suppress the voltage applied between the electrodes of each FET, the level shifter 23 has a configuration based on the cascode connection as described below.

PMOSs P11 to P14 and NMOSs N11 and N12 constitute a first-stage level shifter 21a.

The input level of the differential input terminals INA and INB of the first-stage level shifter 21a has, for example, a high level of 1.8 V and a low level of 0 V. The input is supplied from the not-illustrated decoder in the preceding stage. The high potential terminal 9 is supplied with the first potential Vp, such as 3.5 V.

The PMOSs P13 and P14 constitute a cascode connection stage. The gates thereof are supplied with a bias potential Vb1. By setting Vb1 to, for example, 1 V, the voltage applied between the terminals of each FET is divided. The gate-source voltage Vgs and the drain-source voltage Vds of the PMOS do not exceed 2.8 V. The gate-source voltage Vgs and the drain-source voltage Vds of the NMOS do not exceed 3.5 V.

The differential outputs of the first level shifter 21a are the connection node between the PMOSs P11 and P13, and the connection node between the PMOSs P12 and P14. The high level of these outputs is equal to the first potential Vp, i.e., 3.5 V. The low level thereof is approximately 1.2 V. That is, the output amplitude of the first level shifter 21a is approximately 2.3 V.

PMOSs P21 to P24 and NMOSs N21 to N24 constitute a second level shifter 22a. The second level shifter 22a receives as input the output signal of the first level shifter 21a. The high potential terminal 9 is supplied with the first potential Vp, such as 3.5 V, as in the first level shifter 21a. The low potential terminal 9a is supplied with the second potential Vn, such as −1.5 V.

The PMOSs P23 and P24 and the NMOSs N21 and N22 constitute cascode connection stages. The gates thereof are supplied with the aforementioned bias potential Vb1 and a bias potential Vb2, respectively. The bias potential Vb2 can be set to, for example, 1.8 V. Then, the gate-source voltage Vgs and the drain-source voltage Vds of the PMOS do not exceed 2.8 V. The gate-source voltage Vgs and the drain-source voltage Vds of the NMOS do not exceed 3.5 V. Thus, the output amplitude with a high level of 3.5 V and a low level of −1.5 V can be generated.

In other words, even if the withstand voltage of the NMOS is as low as 3.5 V and the withstand voltage of the PMOS is as low as 2.8 V due to the fine process, a control signal with an output amplitude of 5 V can be generated.

The NMOSs N31 and N32 and the diodes D11 and D12 constitute a circuit for discharge to the ground before discharge to the second potential Vn at the falling edge of the output. This circuit can accelerate the falling edge of the waveform.

Figure 17:
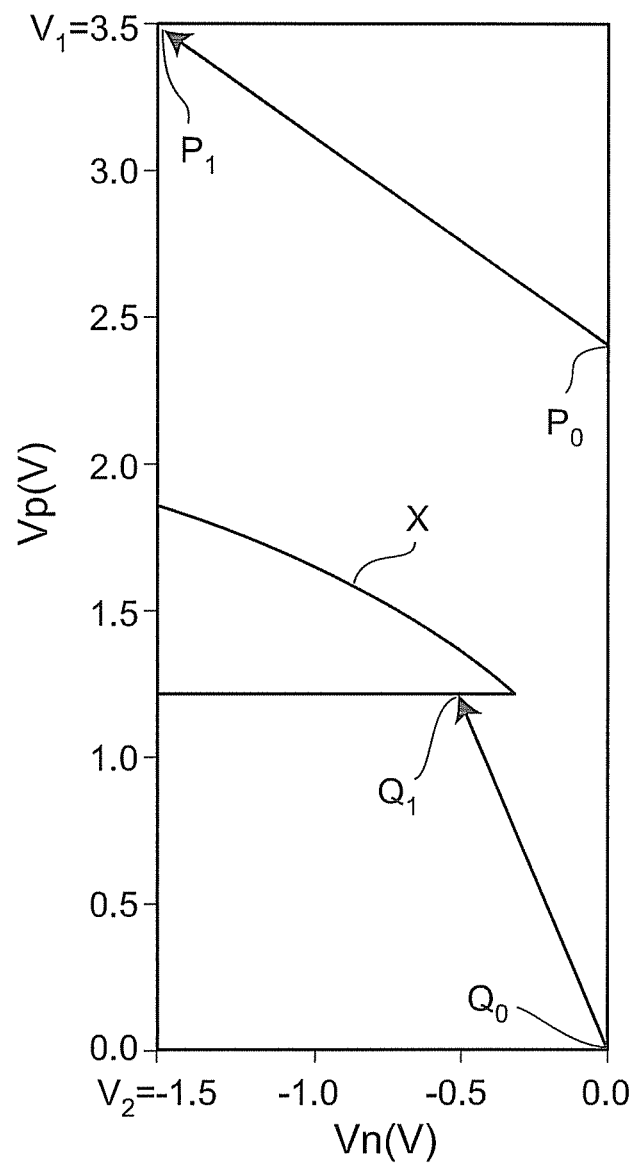
FIG. 17 is a schematic diagram illustrating trajectories of output potentials of the voltage generator.

FIG. 17 is a schematic diagram illustrating trajectories of the output potential of the voltage generator.

FIG. 17 schematically shows the occurrence region (the portion enclosed by the solid line X in the figure) of the cross current occurring in the level shifter 23 shown in FIG. 16, and trajectories of the output potentials of the voltage generator at power-on. More specifically, FIG. 17 shows trajectories of point (Vn, Vp) after power-on, where the vertical axis represents the first potential Vp, and the horizontal axis represents the second potential Vn. The solid line $P_0 P_1$ represents the case with the power supply controller 6. The solid line $Q_0 Q_1$ represents the case without the power supply controller 6.

The cross current occurrence region X is schematically shown as points (Vn, Vp) for the combination of the first and second potentials Vp and Vn at which a cross current occurs.

In the case without the power supply controller 6, the point (Vn, Vp) moves from the point $Q_0$ at power-on toward the point $P_1(V_2, V_1)$ of the desired potentials. However, the trajectory of the point (Vn, Vp) meets the cross current occurrence region X halfway at point $Q_1$. Hence, if the current supply capacity of the charge pumps 12a and 12b is insufficient, the potentials are trapped by the cross current at the first and second potentials Vp and Vn of the halfway point $Q_1$, and fail to reach the desired potentials $V_1$ and $V_2$.

On the other hand, in the case with the power supply controller 6, the point (Vn, Vp) moves from the point $P_0$(0, Vdd) at power-on to the point $P_1(V_2, V_1)$ of the desired potentials. The trajectory of the point (Vn, Vp) does not meet the cross current occurrence region X. Thus, possible malfunctions at power-on can be avoided.

In FIG. 17, the case of using the level shifter 23 is taken as an example. However, this operation also applies similarly to the case of using the level shifter 20 shown in FIG. 4. That is, in the case with the power supply controller 6, the trajectory does not meet the cross current occurrence region. Thus, possible malfunctions at power-on can be avoided.

According to the semiconductor switch 1 as described above, a semiconductor switch that avoids malfunctions in the voltage generator without increasing the layout area can be provided.

In this embodiment, the configuration of the SP8T switch is illustrated. However, similarly, multiport switches such as SPnT and mPnT (m and n being natural numbers of two or more) switches can be configured.

Figure 18:
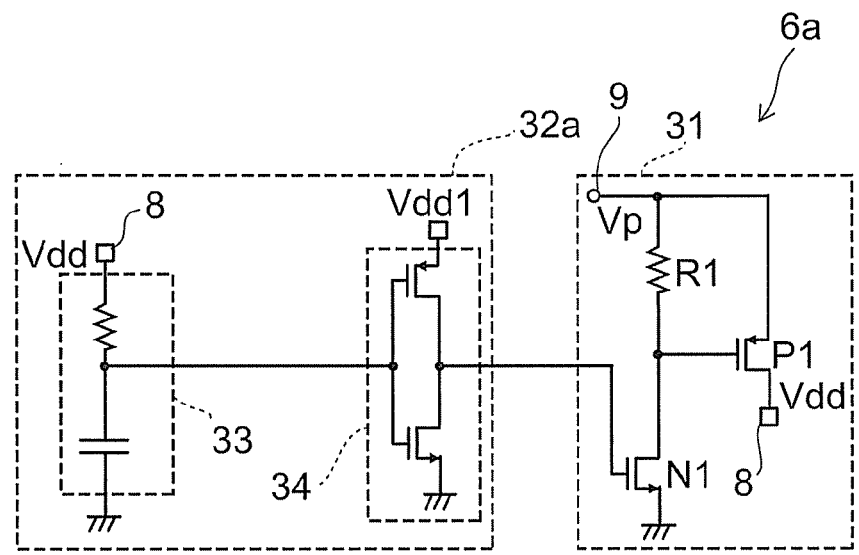
FIG. 18 is a circuit diagram illustrating one other configuration of a power supply controller.

FIG. 18 is a circuit diagram illustrating one other configuration of a power supply controller.

As shown in FIG. 18, the power supply controller 6a includes a connecting circuit 31 and a pulse generator 32a. In other words, the power supply controller 6a has a configuration in which the pulse generator 32 of the power supply controller 6 shown in FIG. 6 is replaced by the pulse generator 32a.

The pulse generator 32a includes an RC time constant circuit (first time constant circuit) 33 and an inverter 34.

The RC time constant circuit (first time constant circuit) 33 is composed of a resistor and a capacitor connected between the power supply terminal 8 and the ground. The terminal voltage of the capacitor of the RC time constant circuit (first time constant circuit) 33 is inputted to the inverter 34. The output of the inverter 34 is inputted to the connecting circuit 31.

When the power supply terminal 8 is powered with the voltage Vdd, the terminal voltage of the capacitor of the RC time constant circuit (first time constant circuit) 33 rises from 0 V to Vdd with a certain time constant. This time constant depends on the capacitance and resistance of the RC time constant circuit (first time constant circuit) 33. The time for the terminal voltage of the capacitor to reach the logic threshold voltage of the inverter 34 is set to be equal to the first period T1.

As described earlier, the first period T1 is the time (e.g., 5 μs) required for the output side capacitor Cp of the low-pass filter 13a to be charged to the power supply voltage Vdd by the power supplied to the power supply terminal 8 through the second transistor P1.

During the first period T1 after power-on, the output of the inverter 34 is high level. The first transistor N1 of the connecting circuit 31 is turned on, and the second transistor P1 remains turned on. Hence, during the first period T1 after power-on, the high potential terminal 9 is connected to the power supply terminal 8, and the first potential Vp is set to the power supply potential Vdd.

After the expiration of the first period T1, the terminal voltage of the capacitor of the RC time constant circuit (first time constant circuit) 33 is higher than the logic threshold voltage of the inverter 34. The output of the inverter 34 turns to low level. The first transistor N1 of the connecting circuit 31 is turned off, and the second transistor P1 is turned off. The high potential terminal 9 is disconnected from the power supply terminal 8, and the first potential Vp rises to the desired potential $V_1$.

Here, the potential Vdd1 of the power supplied to the inverter 34 is, for example, 1.8 V. Alternatively, the potential Vdd1 may be the same as the power supply voltage Vdd.

In FIG. 18, the drain of the second transistor P1 is connected to the power supply terminal 8. However, alternatively, the drain of the second transistor P1 may be connected to the output of the internal regulator 14 shown in FIG. 5, which is connected to the power supply terminal 8 and generates the potential Vdd2 lower than the power supply voltage Vdd.

Here, after the power supply terminal 8 is powered with the voltage Vdd, if the power supply is temporarily turned off, then for a certain period, the terminal voltage of the capacitor of the RC time constant circuit (first time constant circuit) 33 is maintained at a potential higher than the logic threshold of the inverter 34. Hence, if the power supply is reactivated during this period, the charge pumps 12a and 12b start operation without connection between the high potential terminal 9 and the power supply terminal 8. Thus, there is a risk of malfunction.

Figure 19:
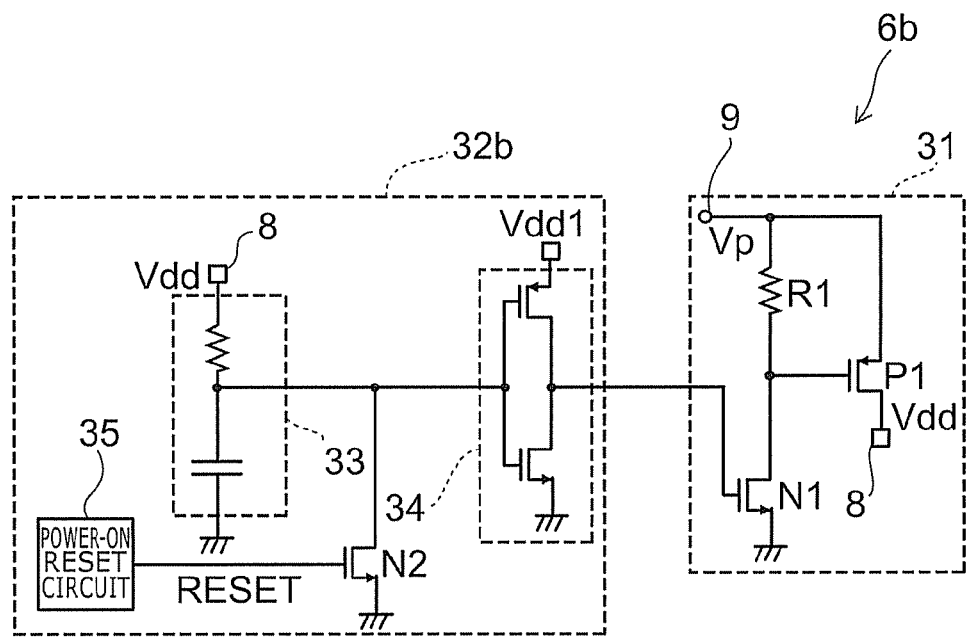
FIG. 19 is a circuit diagram illustrating one other configuration of a power supply controller.

FIG. 19 is a circuit diagram illustrating one other configuration of a power supply controller.

As shown in FIG. 19, the power supply controller 6b includes a connecting circuit 31 and a pulse generator 32b. In other words, the power supply controller 6b has a configuration in which the pulse generator 32a of the power supply controller 6a shown in FIG. 18 is replaced by the pulse generator 32b.

The pulse generator 32b includes an RC time constant circuit (first time constant circuit) 33, an inverter 34, a power-on reset circuit 35, and an NMOS N2. In other words, the pulse generator 32b has a configuration in which the power-on reset circuit 35 and the NMOS N2 are added to the pulse generator 32a shown in FIG. 18.

The power-on reset circuit 35 is a circuit that initializes the pulse generator 32b by outputting a RESET signal, which remains high level for a given period of time at power-on.

Figure 20:
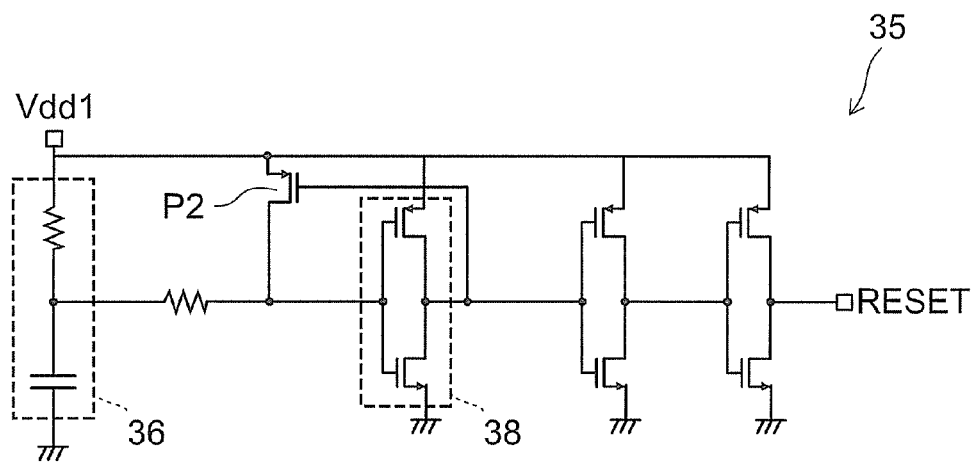
FIG. 20 is a circuit diagram illustrating the configuration of a power-on reset circuit of the power supply controller shown in FIG. 19.

FIG. 20 is a circuit diagram illustrating the configuration of the power-on reset circuit 35 of the power supply controller 6b shown in FIG. 19.

As shown in FIG. 20, the power-on reset circuit 35 includes a three-stage inverter including a first inverter 38 in the first stage, a PMOS (feedback transistor) P2, and an RC time constant circuit (reset time constant circuit) 36.

The power supplied to the power-on reset circuit 35 has the potential Vdd1. Here, the time constant of the RC time constant circuit (reset time constant circuit) 36 is set smaller than that of the RC time constant circuit (first time constant circuit) 33 shown in FIG. 19. The terminal voltage of the capacitor of the RC time constant circuit (reset time constant circuit) 36 is inputted to the three-stage inverter through a resistor. The output of the inverter serves as a RESET signal.

Figure 21A:
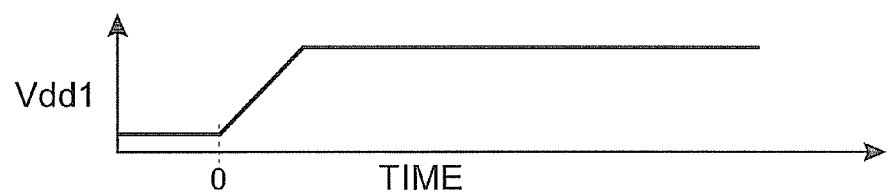
FIGS. 21A and 21B are schematic diagrams showing the operation of the power-on reset circuit of the power supply controller shown in FIG. 19.
Figure 21B:
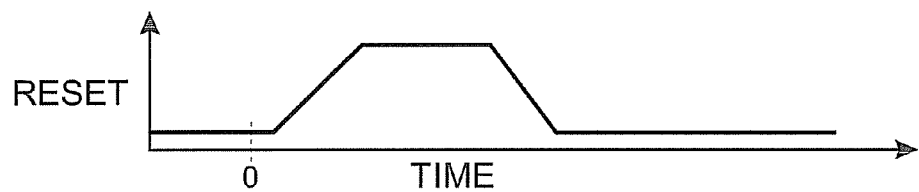

FIGS. 21A and 21B are schematic diagrams showing the operation of the power-on reset circuit 35 of the power supply controller 6b shown in FIG. 19.

FIG. 21A schematically shows the potential Vdd1 of the power supplied to the power-on reset circuit 35. FIG. 21B schematically shows the output signal RESET of the power-on reset circuit 35.

As shown in FIG. 21A, at power-on, the power-on reset circuit 35 is powered with the potential Vdd1 at time t=0.

Upon power-on, the terminal voltage of the capacitor of the RC time constant circuit (reset time constant circuit) 36 rises from 0 V to Vdd1 with a certain time constant. Until the terminal voltage of the capacitor reaches the logic threshold voltage of the three-stage inverter, the three-stage inverter outputs high level.

The output signal RESET is high level, and follows the potential Vdd1 of the power supply of the three-stage inverter.

When the terminal voltage of the capacitor exceeds the logic threshold, the three-stage inverter outputs low level. Accordingly, the output signal RESET turns to low level.

As shown in FIG. 21B, the output signal RESET produces a pulse of high level. The width of this pulse depends on the time constant of the RC time constant circuit (reset time constant circuit) 36, and is set shorter than the first period T1.

Here, the PMOS (feedback transistor) P2 is connected between the input and the output of the first stage (first inverter) 38 of the three-stage inverter to prevent malfunction due to noise.

Referring again to FIG. 19, the output signal RESET of the power-on reset circuit 35 is inputted to the gate of the NMOS N2.

Immediately after power-on, the NMOS N2 provided between the output of the RC time constant circuit (first time constant circuit) 33 and the ground is turned on. Accordingly, immediately after power-on, the output of the RC time constant circuit (first time constant circuit) 33 is reliably set to low level.

The power-on reset circuit 35 thus provided allows the pulse generator 32*b* to be initialized also at power reactivation. Thus, the high potential terminal 9 is reliably connected to the power supply terminal 8. Thereby, malfunction of the voltage generator 7 can be avoided.

In FIG. 19, the drain of the second transistor P1 is connected to the power supply terminal 8. However, alternatively, the drain of the second transistor P1 may be connected to the output of the internal regulator 14 shown in FIG. 5, which is connected to the power supply terminal 8 and generates the potential Vdd2 lower than the power supply voltage Vdd.

Figure 22:
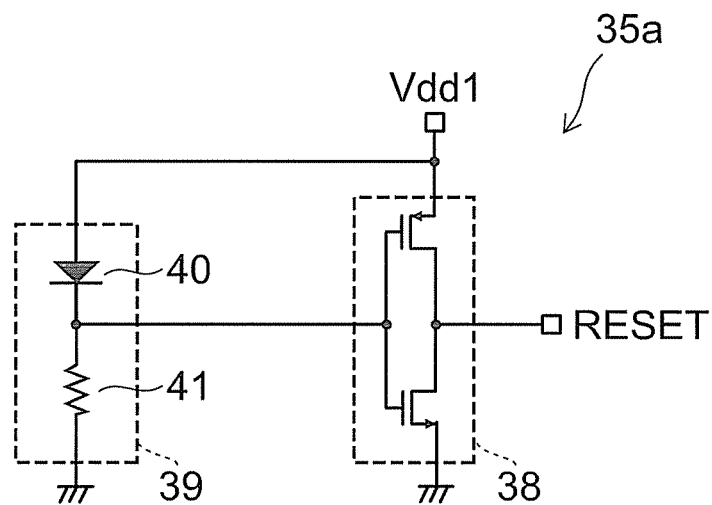
FIG. 22 is a circuit diagram illustrating one other configuration of a power-on reset circuit.

FIG. 22 is a circuit diagram illustrating one other configuration of a power-on reset circuit.

In the power-on reset circuit 35 shown in FIG. 20, if the power supply potential Vdd1 has a long rise time, the RESET signal may fail to produce a pulse.

In the power-on reset circuit 35*a* shown in FIG. 22, the power supply potential Vdd1 is lowered by a step-down circuit 39 and inverted by the first inverter 38 for output as a RESET signal. The step-down circuit 39 is a circuit that lowers the inputted power supply potential Vdd1. The step-down circuit 39 is constructed from a diode 40 and a resistor 41 connected in series. The step-down circuit 39 outputs a voltage lower than the power supply potential Vdd1 by the forward voltage of the diode 40.

Figure 23:
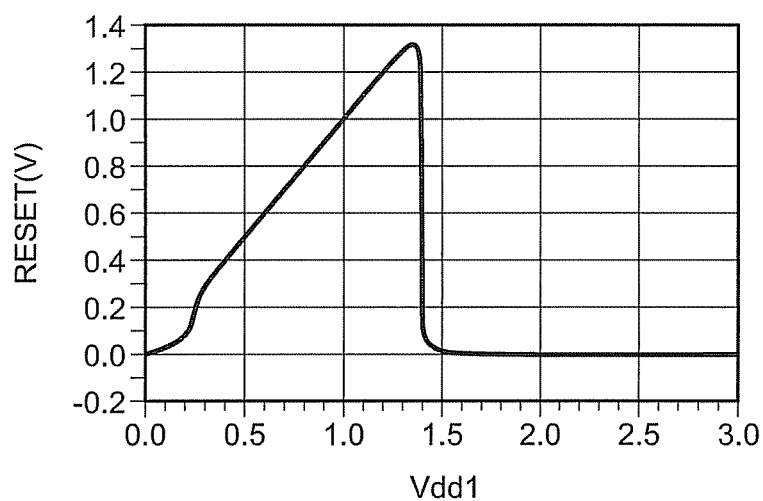
FIG. 23 is a waveform diagram showing DC characteristics of the power-on reset circuit shown in FIG. 22.

The power-on reset circuit 35*a* performs a DC-like operation and has DC characteristics as shown in FIG. 23. Accordingly, even if the power supply potential Vdd1 has a long rise time, a pulse can be reliably produced in the RESET signal.

Here, the rise time of the power supply potential Vdd1 is, for example, 1 μs or more. Thus, a pulse can be produced in the RESET signal by setting a suitable circuit constant in the power-on reset circuit 35*a* of FIG. 22.

Figure 24:
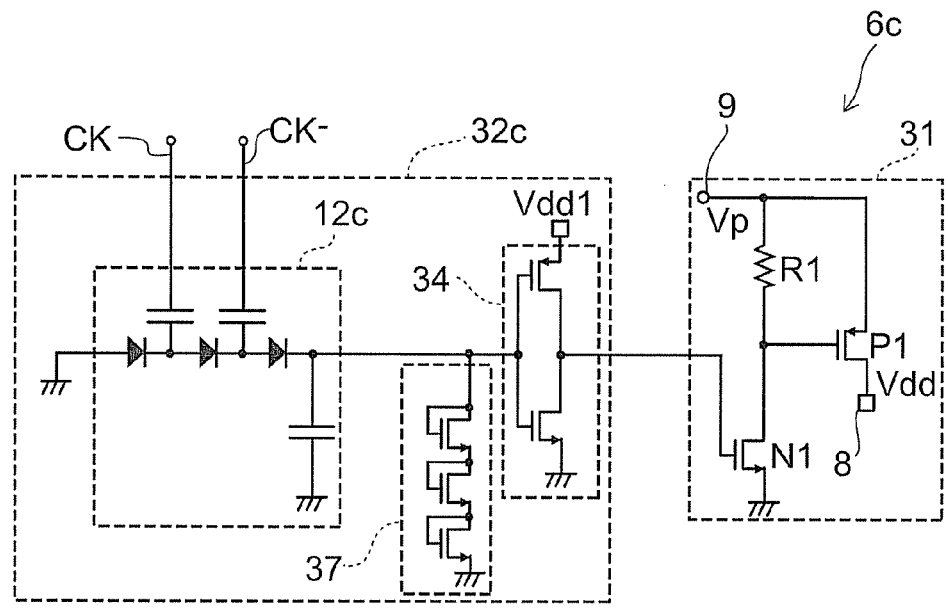
FIG. 24 is a circuit diagram illustrating one other configuration of a power supply controller.

FIG. 24 is a circuit diagram illustrating one other configuration of a power supply controller.

As shown in FIG. 24, the power supply controller 6*c* includes a connecting circuit 31 and a pulse generator 32*c*. In other words, the power supply controller 6*c* has a configuration in which the pulse generator 32*a* of the power supply controller 6*a* shown in FIG. 18 is replaced by the pulse generator 32*c*.

The pulse generator 32*c* includes an inverter 34, a charge pump 12*c*, and a clamp circuit 37. In other words, the pulse generator 32*c* has a configuration in which the RC time constant circuit (first time constant circuit) 33 of the pulse generator 32*a* shown in FIG. 18 is replaced by the charge pump 12*c* and the clamp circuit 37.

At power-on, the output of the charge pump 12*c* rises from 0 V to the potential clamped by the clamp circuit 37. The time for the potential of the output of the charge pump 12*c* to reach the logic threshold of the inverter 34 is set to be equal to the first period T1.

In FIG. 24, the drain of the second transistor P1 is connected to the power supply terminal 8. However, alternatively, the drain of the second transistor P1 may be connected to the output of the internal regulator 14 shown in FIG. 5, which is connected to the power supply terminal 8 and generates the potential Vdd2 lower than the power supply voltage Vdd.

Here, also in the power supply controller 6*c* shown in FIG. 24, like the power supply controller 6*a* shown in FIG. 18, there is a risk of malfunction at power reactivation.

Figure 25:
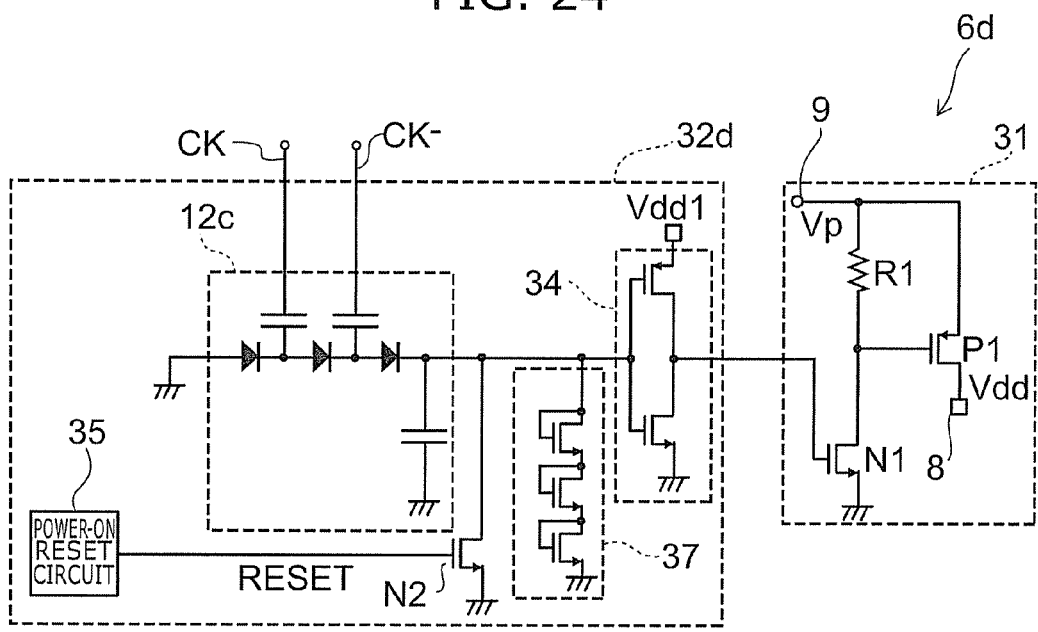
FIG. 25 is a circuit diagram illustrating one other configuration of a power supply controller.

FIG. 25 is a circuit diagram illustrating an alternative configuration of a power supply controller.

As shown in FIG. 25, the power supply controller 6*d* includes a connecting circuit 31 and a pulse generator 32*d*. In other words, the power supply controller 6*d* has a configuration in which a power-on reset circuit 35 is added to the pulse generation of the power supply controller 6*c* shown in FIG. 24.

The power-on reset circuit 35 thus provided allows the pulse generator 32*d* to be initialized also at power reactivation. Thus, the high potential terminal 9 is reliably connected to the power supply terminal 8. Thereby, malfunction of the voltage generator 7 can be avoided.

In FIG. 25, the drain of the second transistor P1 is connected to the power supply terminal 8. However, alternatively, the drain of the second transistor P1 may be connected to the output of the internal regulator 14 shown in FIG. 5, which is connected to the power supply terminal 8 and generates the potential Vdd2 lower than the power supply voltage Vdd.

Figure 26:
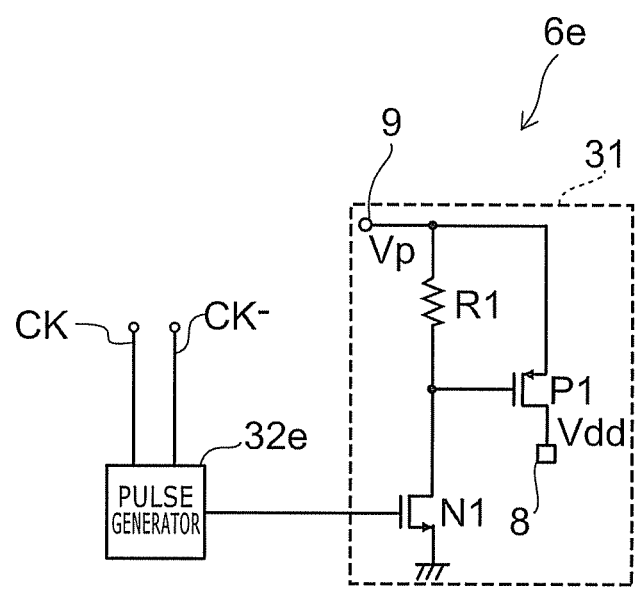
FIG. 26 is a circuit diagram illustrating one other configuration of a power supply controller.

FIG. 26 is a circuit diagram illustrating one other configuration of a power supply controller.

As shown in FIG. 26, the power supply controller 6*e* includes a connecting circuit 31 and a pulse generator 32*e*. In other words, the power supply controller 6*e* has a configuration in which the pulse generator 32 of the power supply controller 6 shown in FIG. 6 is replaced by the pulse generator 32*e*.

The pulse generator 32*e* is a circuit that outputs a pulse of high level for the first period T1 in response to the input of the complementary clocks CK and CK– outputted from the oscillator 11. For example, the pulse generator 32*e* can be constructed from a timer or a counter. The pulse generator 32*e* has a reset function (initialization function) for forcibly setting the output to 0 V immediately after power-on. Thus, an effect similar to that of the power supply controllers 6*b* and 6*d* is achieved.

In FIG. 26, the drain of the second transistor P1 is connected to the power supply terminal 8. However, alternatively, the drain of the second transistor P1 may be connected to the output of the internal regulator 14 shown in FIG. 5, which is connected to the power supply terminal 8 and generates the potential Vdd2 lower than the power supply voltage Vdd.

The embodiments of the invention have been described with reference to examples. However, the invention is not limited thereto. The embodiments can be variously modified within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor switch comprising:
    a voltage generator configured to generate a first potential and a negative second potential;
    a driver connected to an output of the voltage generator and being configured to output the first potential in response to input of high level and to output the second potential in response to input of low level;
    a switch section configured to switch connection between terminals in response to an output of the driver; and
    a power supply controller configured to control the output of the voltage generator to be connected to the power supply terminal during a first period after supplying a power supply voltage to a power supply terminal and control the output of the voltage generator to be disconnected from the power supply terminal after expiration of the first period.

2. The switch according to claim 1, further comprising:
    an internal regulator configured to generate a voltage lower than the power supply voltage,
    the power supply controller controlling connecting the output of the voltage generator to an output of the internal regulator during the first period and disconnecting the output of the voltage generator from the output of the internal regulator after the expiration of the first period.

3. The switch according to claim 1, wherein the power supply controller includes:
    a first transistor with a source connected to ground;
    a first resistor connected between a drain of the first transistor and the output of the voltage generator; and
    a second transistor with a source connected to the output of the voltage generator, a drain connected to the power supply terminal and a gate connected to the drain of the first transistor.

4. The switch according to claim 1, wherein current supply capacity of the output of the voltage generator is lower than a cross current flowing across the driver during the first period.

5. The switch according to claim 1, wherein the power supply controller includes a pulse generator configured to output high level during the first period and to output low level after the expiration of the first period.

6. The switch according to claim 5, wherein the pulse generator includes a first time constant circuit configured to output a voltage rising in the first period in response to the supplying the power supply voltage to the power supply terminal.

7. The switch according to claim 5, wherein the pulse generator includes a charge pump configured to output a voltage rising in the first period in response to the supplying the power supply voltage to the power supply terminal.

8. The switch according to claim 5, wherein the pulse generator includes a power-on reset circuit configured to initialize the pulse generator in response to the supplying the power supply voltage to the power supply terminal.

9. The switch according to claim 8, wherein the power-on reset circuit includes:
    a reset time constant circuit configured to output a voltage rising in a period shorter than the first period in response to the supplying the power supply voltage to the power supply terminal;
    a first inverter; and
    a feedback transistor connected between an input and an output of the first inverter.

10. The switch according to claim 8, wherein the power-on reset circuit includes:
    a step-down circuit configured to lower the power supply voltage; and
    a first inverter configured to invert an output of the step-down circuit.

11. The switch according to claim 10, wherein the step-down circuit includes a diode configured to lower the power supply voltage.

12. The switch according to claim 1, wherein the voltage generator includes:
    an oscillator; and
    a charge pump.

13. The switch according to claim 1, wherein the voltage generator includes a low-pass filter.

14. The switch according to claim 4, wherein the voltage generator includes:
    an oscillator; and
    a charge pump.

15. The switch according to claim 4, wherein the voltage generator includes a low-pass filter.

16. The switch according to claim 2, wherein current supply capacity of the output of the voltage generator is lower than a cross current flowing across the driver during the first period.

17. The switch according to claim 16, wherein the power supply controller further includes a pulse generator configured to output high level during the first period and to output low level after the expiration of the first period.

18. The switch according to claim 17, wherein the pulse generator includes a first time constant circuit.

19. The switch according to claim 17, wherein the pulse generator includes a charge pump.

20. The switch according to claim 17, wherein the pulse generator further includes a power-on reset circuit configured to initialize the pulse generator in response to the supplying the power supply voltage to the power supply terminal.

* * * * *